United States Patent
Neumann et al.

(10) Patent No.: US 9,172,084 B2
(45) Date of Patent: Oct. 27, 2015

(54) METHOD FOR PRODUCING POROUS GRANULES FROM INORGANIC MATERIAL AND THE USE THEREOF

(75) Inventors: Christian Neumann, Hungen (DE); Jörg Becker, Niddatal (DE); Achim Hofmann, Frankfurt (DE)

(73) Assignee: Heraeus Quarzglas GmbH & Co. KG, Hanau (DE)

( * ) Notice: Subject to any disclaimer, the term of this patent is extended or adjusted under 35 U.S.C. 154(b) by 241 days.

(21) Appl. No.: 14/006,929

(22) PCT Filed: Mar. 14, 2012

(86) PCT No.: PCT/EP2012/054442
§ 371 (c)(1),
(2), (4) Date: Oct. 15, 2013

(87) PCT Pub. No.: WO2012/126782
PCT Pub. Date: Sep. 27, 2012

(65) Prior Publication Data
US 2014/0037528 A1   Feb. 6, 2014

(30) Foreign Application Priority Data
Mar. 23, 2011 (DE) .......... 10 2011 014 875

(51) Int. Cl.
| | | |
|---|---|---|
| C04B 38/00 | (2006.01) | |
| C03B 37/00 | (2006.01) | |
| C04B 14/00 | (2006.01) | |
| H01M 4/1393 | (2010.01) | |
| C03B 19/06 | (2006.01) | |
| C03B 19/14 | (2006.01) | |
| C04B 14/02 | (2006.01) | |
| C04B 14/06 | (2006.01) | |
| C04B 18/02 | (2006.01) | |
| C04B 20/00 | (2006.01) | |
| C04B 38/04 | (2006.01) | |
| C23C 16/01 | (2006.01) | |
| C23C 16/40 | (2006.01) | |
| C23C 16/453 | (2006.01) | |
| H01M 10/052 | (2010.01) | |

(52) U.S. Cl.
CPC ............ *H01M 4/1393* (2013.01); *C03B 19/06* (2013.01); *C03B 19/14* (2013.01); *C04B 14/022* (2013.01); *C04B 14/06* (2013.01); *C04B 18/023* (2013.01); *C04B 20/008* (2013.01); *C04B 38/0022* (2013.01); *C04B 38/045* (2013.01); *C23C 16/01* (2013.01); *C23C 16/402* (2013.01); *C23C 16/453* (2013.01); *H01M 10/052* (2013.01); *Y02E 60/122* (2013.01)

(58) Field of Classification Search
CPC .... C04B 14/022; C04B 14/06; C04B 18/023; C04B 20/008; C04B 38/0022; C04B 38/045; C03B 37/005; C03B 19/14; C03B 19/06
See application file for complete search history.

(56) References Cited

U.S. PATENT DOCUMENTS

| 7,677,058 B2 | 3/2010 | Hawtof et al. |
|---|---|---|
| 7,842,269 B2 * | 11/2010 | Schachtely et al. ........... 423/335 |
| 2005/0169829 A1 | 8/2005 | Dai et al. |
| 2008/0280057 A1 | 11/2008 | Hawtof et al. |
| 2010/0179269 A1 * | 7/2010 | Schachtely et al. ........... 524/492 |
| 2012/0301387 A1 | 11/2012 | Neumann |

FOREIGN PATENT DOCUMENTS

| DE | 10243953 A1 | 4/2004 |
|---|---|---|
| EP | 1813574 A1 | 8/2007 |
| WO | 20071085511 A1 | 8/2007 |
| WO | 20081136924 A1 | 11/2008 |
| WO | 20111092149 A2 | 8/2011 |

OTHER PUBLICATIONS

Mbileni C N et al., "Synthesis of mesoporous carbon supports via liquid impregnation of polystyrene onto a MCM-48 silica template", Carbon, vol. 44, Issue 8, Jul. 2006, pp. 1476-1483, Elsevier, Oxford, GB.
Espacenet English language abstract of EP 1813574 A1, published Aug. 1, 2007.
Espacenet English language abstract of DE 10243953 B4, published Nov. 17, 2005.

* cited by examiner

*Primary Examiner* — Colleen Dunn
(74) *Attorney, Agent, or Firm* — Tiajoloff and Kelly LLP

(57) ABSTRACT

Build-up granulation and compaction granulation methods are generally known for producing granules from porous inorganic material. In order to allow a cost-efficient yet also reproducible production of porous granules having a more pronounced hierarchical pore structure, the invention relates to a method comprising the following steps: (a) supplying a feedstock flow to a reaction zone in which the feedstock is converted to material particles by means of pyrolysis or hydrolysis, (b) depositing the material particles on a deposition surface (1*a*) forming a soot layer (5), (c) thermally hardening the soot layer (5) to form a porous soot plate (5*a*), and (d) comminuting the soot plate (5*a*) to form porous granules (13).

22 Claims, 1 Drawing Sheet

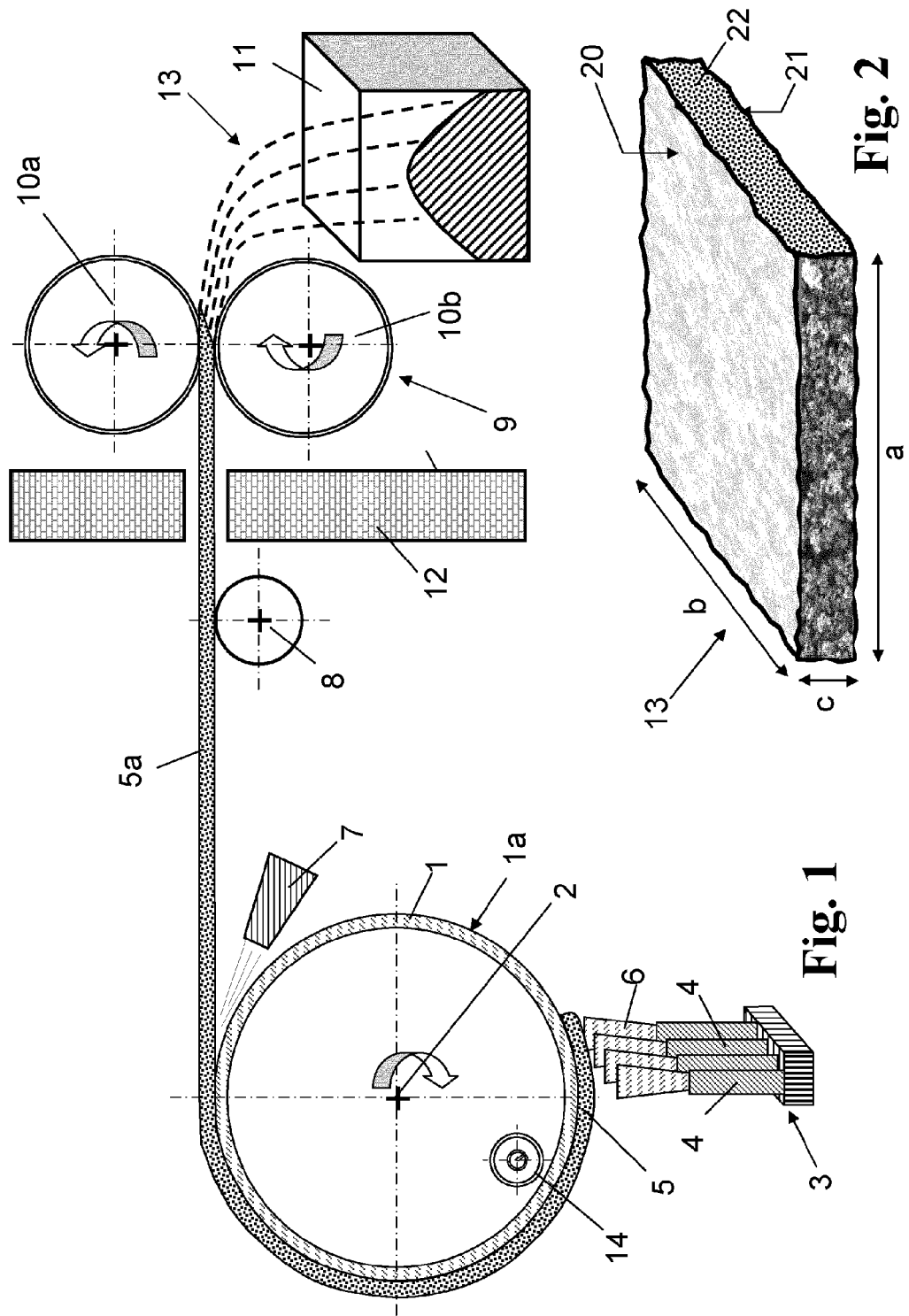

METHOD FOR PRODUCING POROUS GRANULES FROM INORGANIC MATERIAL AND THE USE THEREOF

The present invention refers to a method for producing porous granulate particles of inorganic material.

Furthermore, the present invention refers to a specific use of such granulate particles.

Granulate particles with internal porosity consist of agglomerates or aggregates of primary particles consisting of oxides, nitrides, carbides or borides. Silicon dioxide, tin oxide and titanium nitrides should be mentioned by way of example. The primary particles are e.g. obtained during synthesis by polymerization, polycondensation, precipitation or CVD processes, as is e.g. known for the production of synthetic quartz glass. Due to their low bulk density the primary particles are difficult to handle, and they are normally compressed or densified by way of build-up or compaction granulation methods. Examples to be mentioned are rolling granulation in a dish granulator, spray granulation, centrifugal atomization, fluidized-bed granulation, granulation methods using a granulating mill, compaction, roller pressing, briquetting, flake production or extrusion.

The porous granulate particles which are here discrete and which are mechanically and possibly also thermally pre-densified are thus composed of a multitude of primary particles. In their entirety, they form the "granulate".

Prior Art

DE 102 43 953 A1 describes a typical build-up granulation method in which loose, pyrogenically produced $SiO_2$ powder (so-called "soot dust"), as is obtained as filter dust in quartz glass production, is mixed into water, whereby a suspension is produced. Said suspension is processed by means of a wet granulation method into $SiO_2$ granulate grains that after drying and cleaning are thermally densified by heating in a chlorine-containing atmosphere and are thereby sintered into transparent quartz glass granules having grain diameters of about 140 μm.

WO 2007/085511 A1 describes a granulation method in which finely divided start powder is agglomerated mechanically—also by using lubricants or binders—by way of roller compaction into rather coarse particles and densified by mechanical pressure. Finely divided silica powder is passed in this process between counter-rotating rollers, which may be smooth or profiled, and is thereby densified into $SiO_2$ granulate, which is obtained in the form of so-called "crusts" or flakes. These form more or less strip-like structures that are normally broken and classified according to size. The flake fragments can be dried at a temperature ranging from 400° to 1100° in a halogen-containing atmosphere and are densely sintered in the range of 1200° C. to 1700° C. into a "silica glass granulate".

The known granulation methods start from finely divided powder, such as $SiO_2$ soot powder. This powder is processed in further process steps that are tedious in part and require a high energy input. The granulate particles obtained thereby often show a spherical morphology. An internal porosity of the granulate, which will remain after mechanical and/or thermal densification, depends on densification-relevant properties of the powder-like start material and the corresponding granulation process.

The porous granulate is e.g. used as a filler or for producing opaque quartz glass. It is however not unrestrictedly qualified as a semifinished product for producing electrode material of rechargeable lithium batteries.

In the electrode material of rechargeable lithium batteries it should be possible to reversibly intercalate and deintercalate lithium at a low charge loss. To this end one aims at a high porosity (permeability) together with a surface of the electrode material that is as small as possible at the same time. A specific type of internal porosity, which is known as "hierarchical porosity", is here conducive, wherein pores in the nanometer range are interconnected via a continuous macroporous transport system, which enhances the accessibility to said pores from the outside.

The production of a semifinished product with a suitable internal pore structure is known from US 2005/0169829 A1. A dispersion consisting of silica beads with diameters of from 800 nm to 10 μm and of a polymerizable substance is here heated in a mold so that the polymerization process yields a porous silica gel that after removal of the excessive liquid is dried and completely polymerized.

This material serves as a so-called "template" for producing a monolithic carbon product with a hierarchical pore structure of macropores and mesopores. To this end the pores of the $SiO_2$ template are impregnated with a precursor substance for carbon, the carbon precursor substance is carbonized into carbon and the $SiO_2$-template is subsequently removed by dissolution in HF or NaOH.

This way of producing the $SiO_2$ template requires great efforts in terms of time and material, which is not acceptable particularly for applications for mass produced articles, such as secondary batteries, where low manufacturing costs are decisive.

Technical Objective

It is the object of the present invention to indicate a method which permits an inexpensive and also reproducible production of porous granulate with a stronger manifestation of a hierarchical pore structure.

Moreover, it is the object of the present invention to indicate a suitable use for said granulate particles.

General Representation of the Invention

As for the method, this object is achieved according to the invention by a method comprising the following method steps:
(a) feeding a feedstock material stream to a reaction zone in which the feedstock material is converted by pyrolysis or hydrolysis to material particles,
(b) depositing the material particles on a deposition surface with formation of a soot layer,
(c) thermally consolidating the soot layer into a porous soot plate,
(d) comminuting the soot plate into the porous granulate particles.

The method according to the invention comprises a soot deposition process. A liquid or gaseous start substance is here subjected to a chemical reaction (hydrolysis or pyrolysis) and deposited from the gas phase as a solid component onto a deposition surface. The reaction zone is for instance a burner flame or an electric arc (plasma). With the help of such plasma or CVD deposition methods, which are e.g. known under the names OVD, VAD, POD methods, synthetic quartz glass, tin oxide, titanium oxide and other synthetic materials are produced on an industrial scale.

The deposition surface is e.g. a vessel, a mandrel, an outer cylindrical surface, a plate or a filter. The porous soot deposited thereon is obtained in the form of a soot layer. Its porosity is ensured in that the temperature of the deposition surface is kept so low that a dense sintering of the deposited material is prevented.

Primary particles with particle sizes in the nanometer range are formed in the reaction zone; on their way to the deposition surface these particles will agglomerate in the form of more or less spherical agglomerates or aggregates. Depending on the degree of the interaction with the reaction zone on their way to the deposition surface, different numbers of primary particles are agglomerating, normally resulting in a broad particle size distribution in the range of about 5 nm to about 200 nm. Within the aggregates and agglomerates, particularly small voids and pores in the nanometer range are present between the primary particles as so-called mesopores, whereas larger voids or pores are formed between the individual aggregates and agglomerates, thereby forming a system of interconnected macropores in the thermally consolidated soot plate and in parts thereof. This internal pore structure with an oligomodal pore size distribution is typical of the desired "hierarchical porosity" of the porous material. Hence, an anisotropic mass distribution with hierarchical pore structure is produced by means of the soot deposition process.

A certain thermal consolidation of the soot layer into a porous soot plate is desired. The thermal consolidation is achieved in that the soot layer is partly sintered either in the deposition process or as an alternative or as a supplement thereto in a separate heating process subsequent to the deposition process. The aim of the thermal consolidation is a porous soot plate with a certain mechanical stability that is sufficient to obtain—during subsequent comminution of the soot plate—those granulate particles that are reproducibly greater than the primary particles, and the dimensions of which are of a small defined size at least in the thickness direction of the plate. These dimensions of the granulate particles are advantageous for infiltration processes whenever a high homogeneity of the infiltration is desired, as shall be explained further below in more detail.

Prior to the comminution of the consolidated porous soot plate the latter is removed from the deposition surface. As an alternative, the soot plate is comminuted into the porous granulate particles directly on the deposition surface.

On account of its relatively small mechanical strength, small forces are sufficient for comminuting the soot plate into the porous granulate particles. The comminuting process is performed by cutting or breaking the soot plate. Breaking also yields granulate particles with a relatively small particle size distribution, for the dimension of the granulate particles, when viewed in the direction of the soot plate, is limited by the thickness thereof. In the simplest case the corresponding dimension of the granulate particles conforms to the thickness of the soot plate; it can also be smaller, especially in cases where the soot plate easily delaminates due to a layerwise build-up. A narrow particle size distribution is particularly advantageous for applications where the granulate particles require a homogeneous infiltration from the outside with a liquid or gaseous substance within the shortest possible period of time.

In comparison with the production methods explained at the outset, the soot deposition method permits an inexpensive production of porous soot granulate particles on an industrial scale; these are distinguished by a hierarchical pore structure.

It has turned out to be useful when a soot plate is produced with a thickness in the range of 10 μm to 500 μm, preferably in the range of 20 μm to 100 μm, particularly preferably less than 50 μm.

The thickness of the soot plate defines the maximum thickness of the granulate particles. These can be thinner than the soot plate, but not thicker. As a rule, this dimension of the granulate particles, defined by a substantially planar top side and a substantially planar bottom side, simultaneously represents the minimal dimension thereof. Therefore, possible time-dependent infiltration processes that take place across the top side and/or the bottom side require only a small period of time for the optimally homogeneous penetration of the granulate particles. In the case of granulate particles having a thickness of more than 500 μm, this advantage is decreasing, and granulate particles of less than 10 μm are mechanically less stable and complicate the formation of a pronounced hierarchical structure.

The thermally densified soot plate which is produced by soot deposition can be comminuted by taking small efforts, whereby granulate particles of plate- or flake-shaped morphology are obtained. These are thus characterized by a non-spherical morphology which can be infiltrated in a particularly homogeneous and rapid way.

The reason is that particles with a spherical morphology, i.e. particles with a ball shape or an approximately ball-shaped morphology, manifest a small surface as compared with their volume. By contrast, granulate particles with a non-spherical morphology show a greater surface-to-volume ratio, which simplifies and homogenizes infiltration with a liquid substance.

Granulate particles that are plate- or rod-shaped with a structure ratio of at least 5, preferably of at least 10, turn out to be particularly useful in this respect.

"Structure ratio" is here to be understood as the ratio of maximum structure width of the granulate particles and the thickness thereof. A structure ratio of at least 5 thus means that the maximum structure width of a granulate particle is at least 5 times greater than its thickness. Such granulate particles have the shape of a small plate or rod and are distinguished by two large surfaces extending substantially in parallel and having open pores, through which the infiltration of a liquid substance can take place relatively rapidly as the thickness of the volume to be filled is comparatively small.

This is promoted when the granulate particles are laterally provided with fracture surfaces having open pores.

The reason is that an infiltration of a liquid substance can also take place in this embodiment of the granulate particles through the open lateral fracture surfaces thereof.

The smaller the thickness of the granulate particles, the simpler and more homogeneous is a possible infiltration. It has turned out to be advantageous in this respect when the granulate particles have a mean thickness in the range of 10 μm to 500 μm, preferably in the range of 20 μm to 100 μm, particularly preferably less than 50 μm.

Granulate particles with a thickness of less than 10 μm have a low mechanical strength and complicate the formation of a pronounced hierarchical pore structure. At thicknesses of more than 500 μm it gets more and more difficult to ensure a homogeneous infiltration.

To minimize the production costs, a continuous production of the granulate particles is desired. To this end the deposition surface may e.g. be configured as a revolving conveyor path. It has also turned out to be particularly useful when the deposition surface is formed as an outer cylinder surface of a drum rotating about a rotation axis.

In the simplest case the drum has a round cross-section; it may be configured as a solid cylinder or as a hollow cylinder. Its surface preferably consists of a material which does not bind with the material of the soot layer at the given deposition and densification temperature, thereby facilitating the removal of the soot layer. It may consist of plural materials, such as a metallic inner jacket which is surrounded by a ceramic outer jacket for protection against corrosive attacks.

WO 2008/136924 A1 discloses a method for producing a quartz glass plate. $SiO_2$ soot particles are here produced by means of a plurality of flame hydrolysis burners and deposited on the outer cylinder surface of a drum rotating about its central axis as a soot layer having a density in the range of 0.8 to 1.25 $g/cm^3$. The soot layer is removed from the drum and directly supplied to a heating zone and vitrified therein into a quartz glass plate with a thickness between 10 μm and 40 μm. The apparatus known from this publication is also suited for producing porous granulate on the basis of the method according to the invention.

Preferably, the diameter of the drum is so large that the soot layer is completely formed after less than one revolution of the drum about the rotation axis.

This simplifies the removal of the soot layer from the outer cylinder surface of the drum.

Especially with respect to a rapid and homogeneous formation of the soot layer at only one revolution of the drum, a method variant has turned out to be advantageous wherein the formation of the soot layer is carried out by means of an assembly of deposition burners which is reversingly moved along the rotation axis.

The deposition burners are here mounted at a fixed distance relative to one another in a row or offset relative to one another on a joint burner bench, which is reciprocated over a route shorter than the width of the deposition surface. One or plural burner rows of such a type are provided.

As an alternative, and equally preferred with respect to an economic procedure and homogeneous formation of the soot layer, the soot layer is formed by means of a stationary linear burner having a longitudinal axis extending along the drum.

The linear burner produces a plurality of burner flames directly side by side in a flame row extending over the width of the deposition surface. One or plural flame rows of such types are provided.

In the simplest case the thermal densification of the soot layer for obtaining the soot plate is directly carried out during the deposition process of the soot particles by way of heating by using the deposition burner(s). The surface temperature can thereby be set in the area of the soot layer such that an adequate densification is achieved. The thermal densification of the soot layer according to method step (c) can however also advantageously include heating by means of at least one additional burner.

By using one or plural additional burners for densification it is possible to optimally adapt the deposition burner(s) to the deposition process and the additional burners to the densification task.

It has turned out to be useful when the deposition surface is formed on a hollow body which is temperature-controlled from the inside.

The efficiency of the deposition process, the degree of densification or the removal of the soot layer can be optimized by heating or cooling the deposition surface.

It has turned out to be advantageous when the soot plate has a relative density, based on the specific maximum density of the material, in the range of 10% to 40%, preferably less than 25%.

The lower the mean density of the soot plate, the greater is the available pore volume and the smaller are the material loss and the efforts taken for removing the material during use as a template material. Densities of less than 10%, however, result in low mechanical stability, which complicates the handling and use of the granulate. The density of the porous soot plate is e.g. set by the surface temperature during the soot deposition process, by the temperature in a separate densification process and/or by the exertion of mechanical pressure on the soot layer.

The soot plate is removed from the deposition surface for comminuting according to method step (d) while being blown at with a gas stream from the bottom side of the soot plate.

With the help of the gas stream the soot plate is continuously lifted from the base and supplied to the comminuting process. This procedure for removing material from a transportation belt is generally known under the name "air knife" or "air blade".

It has here turned out to be advantageous when comminuting the soot plate according to method step (d) is carried out in a zone which is separated in space at least in part from the deposition surface.

This reduces the input of dust from the comminuting process into the deposition area.

The soot plate is preferably comminuted by breaking or cutting.

Since the soot plate shows a low mechanical stability, comminuting can simply be carried out by breaking or cutting. It is for instance enough to pass the soot plate between profiled rolls so as to break the same. In contrast to grinding methods in which impurities may easily be introduced into the grinding material due to abrasion of mechanical grinding tools and which as a rule lead to a broad particle size distribution, the risk of the input of impurities during breaking and cutting is small, and the broken or cut granulate particles particularly manifest a narrow particle size distribution in a reproducible manner.

The inorganic material is preferably $SiO_2$. Synthetic $SiO_2$ can be produced on an industrial scale at relatively low costs by means of soot deposition methods using inexpensive start substances.

As for the use of the granulate particles, the above-mentioned object is achieved according to the invention in that it is used as a template material for producing a product of porous carbon.

Soot layers of synthetically produced inorganic material, particularly of $SiO_2$, are distinguished by a high thermal stability and by an anisotropic pore distribution which makes them directly suited for use as a template material for the production of porous carbon flakes or platelets. The resulting carbon flakes or platelets consist of a porous carbon skeleton with a layered morphology and hierarchical pore structure. This is achieved due to the production of the granulate particles by gas phase deposition, as has been explained above in more detail on the basis of the method according to the invention.

Embodiment

The invention shall now be explained in more detail with reference to embodiments and a drawing. In detail, in a schematic view FIG. 1 shows an apparatus for producing $SiO_2$ granulate particles;

FIG. 2 shows a $SiO_2$ granulate particle on an enlarged scale.

The apparatus shown in FIG. 1 serves to produce porous granulate particles of $SiO_2$. It comprises a drum 1 which is rotatable about its rotation axis 2 and which consists of a base body made of special steel, which is covered with a thin layer of silicon carbide. The drum 1 has an outer diameter of 30 cm and a width of 50 cm. A layer 5 of SiO$_2$ soot is deposited on the outer surface 1a of the drum and directly vitrified into a SiO$_2$ plate.

Flame hydrolysis burners 4 are used for the soot deposition; of these burners, four are arranged in successive order in a joint burner row 3 in the direction of the longitudinal axis 2 of the drum. The burner row 3 is reciprocated in parallel with the rotation axis 2 between two stationary turning points. The flame hydrolysis burners 4 are fed with oxygen and hydrogen as fuel gases and with octamethylcyclotetrasiloxane (OMCTS) as feedstock material for the formation of SiO$_2$ particles. The size of the SiO$_2$ primary particles produced thereby is in the nanometer range, wherein plural primary particles agglomerate in the burner flame 6 and are obtained in the form of more or less spherical aggregates with a specific BET surface area in the range of 50 m$^2$/g, which form a continuous, uniformly thick SiO$_2$ soot layer 5 on the outer surface 1a of the drum.

In the embodiment the rotation speed of the drum 1 and the deposition rate of the flame hydrolysis burners 4 are matched such that one obtains a SiO$_2$ soot layer 5 with a width of about 40 cm and a thickness of about 45 μm (the soot layer is drawn in FIG. 1 with an exaggerated thickness for reasons of illustration). The burners 4 simultaneously effect a certain pre-sintering of the soot layer 5 into a soot plate 5a by producing a mean temperature of about 1200° C. on the surface of the topmost soot layer. The pre-sintering process is supported by a tubular infrared radiator 14 which is arranged within the drum 1, which is formed as a hollow drum, in the left lower quadrant, and which heats the outer surface of the drum 1 from the inside shortly after the application of the soot layer 5.

The porous and slightly pre-sintered soot plate 5a obtained in this way has a mean relative density of about 22% (based on the density of quartz glass with 2.21 g/m$^3$).

After slightly more than half a drum revolution the soot plate 5a passes into the exposure area of a blower 7 by means of which a gas stream is produced that is directed against the bottom side of the soot plate 5a, so that the soot plate 5a lifts off from the outer surface 1a of the drum.

The soot plate 5a is subsequently supplied via a support roll to a crushing tool 9 which consists of two counter-rotating rolls 10a, 10b between which a gap is provided having the thickness of the soot plate 5a, and the surfaces of which are provided with longitudinal profiles.

The soot plate 5a which passes through the gap is comminuted by the longitudinal profiles of the rolls 10a, 10b into fragments having about the same size (granulate particles 13), which are collected in a collection container 11.

A partition wall 12 is provided between the drum 1 and the crushing tool 9; the partition wall is here provided with an opening for passing the soot plate 5a therethrough and serves to shield the soot deposition process against the effects of the comminuting process.

In an alternative embodiment of the method according to the invention, a linear burner which extends along the rotation axis 2 of the drum 1 is provided instead of the separate deposition burners 4.

After deposition of the soot layer by means of the linear burner said layer is directly sintered—also under the action of the drum heating—to such an extent that a soot density of 22% (based on the density of transparent quartz glass) is obtained.

The granulate particles 13 obtained according to the method have a platelet- or flake-like morphology and a thickness that corresponds approximately to the thickness of the soot plate 5a, i.e., about 45 μm. Due to the crushing operation described, the granulate particles 13 also have about the same size, so that a narrow grain size distribution is achieved.

FIG. 2 schematically shows such a non-spherical, platelet-like SiO$_2$ granulate particle 13 according to the invention. The granulate particle 13 has a more or less planar top side 20 and a bottom side 21 extending in parallel therewith as well as lateral fracture surfaces 22, each with open pores. The thickness dimension is designated by "c" and the two lateral dimensions by "a" and "b". The structure ratio "A", i.e. the ratio of maximum structure width (a or b) and thickness (c) of the granulate particles 13, is about 10 in the embodiment.

The granulate particles 13 produced thereby serve as a template for the production of porous carbon flakes. For this purpose they are homogeneously intermixed with finely ground pitch powder in the volume ratio 1.6:1 (pitch:granulate particles), and the particle mixture is heated to a temperature of 300° C.

The pitch of low viscosity envelopes the small SiO$_2$ granulate particles 13 and penetrates into and infiltrates the pores. The ratio of pitch and granulate particle volume is here chosen such that the pitch fills the pores to such an extent that no significant free pore volume is observed anymore and is almost entirely consumed in the free melt.

After an infiltration period of 30 min the temperature is raised to 700° C., and the pitch is thereby carbonized. A porous composite mass of non-spherical porous SiO$_2$ granulate particles is thereby formed; these are covered on the outside with a layer of graphitizable carbon and their pores are thereby filled almost entirely.

The SiO$_2$ granulate particles are subsequently removed in that the composite mass is introduced into a hydrofluoric acid bath. After the SiO$_2$ granulate particles have been etched away, a preliminary product of porous carbon is obtained with a structure that substantially represents a negative imprint of the original porous SiO$_2$ granulate particles and shows a hierarchical pore structure in the case of which a multitude of relatively large pore channels (macropores) pass through an otherwise finely rugged surface structure.

The carbon product obtained thereby is flushed, dried and further comminuted in case of need. This yields carbon flakes in the case of which a finely rugged surface is penetrated by rather large voids in the manner of channels. A measurement of the specific inner surface area according to the BET method yields measurement values of about 50 m$^2$/g.

These carbon flakes of porous carbon with a hierarchical pore structure are particularly well suited for the production of electrode layers of rechargeable lithium batteries, particularly for composite electrodes.

The invention claimed is:

1. A method for producing porous granulate particles of inorganic material, said method comprising:
    (a) feeding a streaming feedstock material to a reaction zone in which the feedstock material is converted by pyrolysis or hydrolysis to material particles of the inorganic material,
    (b) depositing the material particles on a deposition surface so as to form a soot layer,
    (c) thermally consolidating the soot layer into a porous soot plate,
    (d) comminuting the soot plate into the porous granulate particles.

2. The method according to claim 1, wherein the soot plate is produced with a thickness in a range of 10 μm to 500 μm.

3. The method according to claim 1, wherein the granulate particles have a non-spherical morphology.

4. The method according to claim 3, wherein the granulate particles are plate-shaped or rod-shaped with a structure ratio of at least 5.

5. The method according to claim 4, wherein the granulate particles are laterally provided with fracture surfaces having open pores.

6. The method according to claim 1, wherein the granulate particles have a mean thickness in a range of 10 μm to 500 μm.

7. The method according to claim 1, wherein the deposition surface is an outer cylinder surface of a drum rotating about a rotation axis.

8. The method according to claim 7, wherein the soot layer is formed after less than one revolution of the drum about the rotation axis.

9. The method according to claim 7, wherein the formation of the soot layer includes reversibly moving an assembly of deposition burners along the rotation axis.

10. The method according to claim 7, wherein the formation of the soot layer is carried out using a stationary linear burner having a longitudinal axis extending along the drum.

11. The method according to claim 1, wherein the thermal consolidating of the soot layer includes heating with at least one additional burner.

12. The method according to claim 1, wherein the deposition surface is formed on a hollow body which is temperature-controlled from an inside thereof.

13. The method according to claim 1, wherein the soot plate has a relative density, based on a specific maximum density of the material, in a range of 10% to 40%.

14. The method according to claim 1, wherein the soot plate is removed from the deposition surface for said comminuting while being blown at with a gas stream from a bottom side of the soot plate.

15. The method according to claim 1, wherein said comminuting of the soot plate is carried out in a zone that is separated in space at least in part from the deposition surface.

16. The method according to claim 1, wherein said comminuting of the soot plate includes crushing.

17. The method according to claim 1, wherein the soot plate is produced with a thickness of less than 50 μm.

18. The method according to claim 1, wherein the soot plate is produced with a thickness in a range of 20 μm to 100 μm.

19. The method according to claim 3, wherein the granulate particles are plate-shaped or Ted-shaped with a structure ratio of at least 10.

20. The method according to claim 1, wherein the granulate particles have a mean thickness in a range of 20 μm to 100 μm.

21. The method according to claim 1, wherein the granulate particles have a mean thickness of less than 50 μm.

22. The method according to claim 1, wherein the soot plate has a relative density of less than 25% compared to a specific maximum density of the material.

* * * * *